# (12) United States Patent
Tsai et al.

(10) Patent No.: US 8,946,713 B2
(45) Date of Patent: Feb. 3, 2015

(54) ELECTROSTATIC DISCHARGE PROTECTION STRUCTURE FOR AN ACTIVE ARRAY SUBSTRATE

(71) Applicant: E Ink Holdings Inc., Hsinchu (TW)

(72) Inventors: Xue-Hung Tsai, Hsinchu (TW); Chia-Chun Yeh, Hsinchu (TW); Henry Wang, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 136 days.

(21) Appl. No.: 13/684,586

(22) Filed: Nov. 26, 2012

(65) Prior Publication Data

US 2013/0207113 A1    Aug. 15, 2013

(30) Foreign Application Priority Data

Feb. 10, 2012 (TW) .............................. 101104429 A

(51) Int. Cl.
| H01L 29/04 | (2006.01) |
| H01L 29/10 | (2006.01) |
| H01L 31/00 | (2006.01) |
| H01L 29/786 | (2006.01) |
| H01L 27/12 | (2006.01) |
| H01L 27/02 | (2006.01) |

(52) U.S. Cl.
CPC .......... *H01L 29/786* (2013.01); *H01L 27/1225* (2013.01); *H01L 27/0296* (2013.01)
USPC ......... 257/59; 257/43; 257/355; 257/E27.014

(58) Field of Classification Search
CPC .............. H01L 29/786; H01L 29/7869; H01L 29/78696; H01L 27/0266; H01L 27/0248
USPC ................................ 257/43, 59, 355, E27.014
See application file for complete search history.

(56) References Cited

U.S. PATENT DOCUMENTS

| 5,668,032 A | 9/1997 | Holmberg |
| 5,867,301 A | 2/1999 | Engle |
| 6,246,458 B1 | 6/2001 | Koma et al. |

(Continued)

FOREIGN PATENT DOCUMENTS

| TW | 200931758 A | 7/2009 |
| WO | 2010147032 A1 | 12/2010 |

OTHER PUBLICATIONS

Corresponding TW Office Action that these art references were cited.

*Primary Examiner* — Meiya Li
*Assistant Examiner* — Peter M Albrecht
(74) *Attorney, Agent, or Firm* — CKC & Partners Co., Ltd.

(57) ABSTRACT

Disclosed herein is an electrostatic discharge protection structure which includes a signal line, a thin-film transistor and a shunt wire. The thin-film transistor includes a gate electrode, a metal-oxide semiconductor layer, a source electrode and a drain electrode. The first metal-oxide semiconductor layer is disposed above the first gate electrode. The metal-oxide semiconductor layer has a channel region characterized in having a width/length ratio of less than 1. The source electrode is equipotentially connected to the gate electrode. The shunt wire is electrically connected to the drain electrode. When the signal line receives a voltage surge of greater than a predetermined magnitude, the voltage surge is shunted through the thin-film transistor to the shunt wire.

8 Claims, 4 Drawing Sheets

(56) References Cited

U.S. PATENT DOCUMENTS

| | | |
|---|---|---|
| 6,333,522 B1 | 12/2001 | Inoue et al. |
| 6,404,413 B1 | 6/2002 | Harris |
| 6,597,019 B2 | 7/2003 | Inoue et al. |
| 7,304,351 B2 | 12/2007 | Liu et al. |
| 7,342,579 B2 | 3/2008 | Chou et al. |
| 7,372,513 B2 | 5/2008 | Choi |
| 7,379,127 B2 | 5/2008 | Tsao |
| 7,532,264 B2 | 5/2009 | Yuan et al. |
| 7,551,240 B2 | 6/2009 | Tsai et al. |
| 7,626,647 B2 | 12/2009 | Ker et al. |
| 7,737,637 B2 | 6/2010 | Koshihara et al. |
| 7,738,223 B2 | 6/2010 | Ker et al. |
| 7,928,437 B2 | 4/2011 | Shin et al. |
| 2002/0009890 A1* | 1/2002 | Hayase et al. ............. 438/706 |
| 2005/0140836 A1 | 6/2005 | Choi |
| 2006/0092591 A1 | 5/2006 | Yuan et al. |
| 2007/0007523 A1 | 1/2007 | Lai |
| 2007/0194303 A1 | 8/2007 | Harada |
| 2008/0117558 A1 | 5/2008 | Shih et al. |
| 2008/0123004 A1* | 5/2008 | Lin et al. .................. 349/40 |
| 2008/0156368 A1 | 7/2008 | Hirose et al. |
| 2009/0134390 A1 | 5/2009 | Kodama et al. |
| 2009/0174975 A1* | 7/2009 | Huang et al. .............. 361/56 |
| 2009/0302456 A1 | 12/2009 | Oikawa et al. |
| 2010/0072548 A1 | 3/2010 | Eguchi et al. |
| 2010/0244021 A1* | 9/2010 | Uochi et al. .............. 257/43 |
| 2011/0068334 A1 | 3/2011 | Yamazaki et al. |
| 2011/0102309 A1 | 5/2011 | Cho |

* cited by examiner

ELECTROSTATIC DISCHARGE PROTECTION STRUCTURE FOR AN ACTIVE ARRAY SUBSTRATE

CROSS REFERENCE TO RELATED APPLICATIONS

This application claims priority to Taiwan Application Serial Number 101104429, filed Feb. 10, 2012, the disclosures of which are incorporated herein by reference in their entireties.

BACKGROUND

1. Technical Field

The present invention relates to an electrostatic discharge (ESD) protection structure. More particularly, the present invention relates to an ESD protection structure formed on an active array substrate for a display device.

2. Description of Related Art

Liquid crystal display devices (LCDs) have been widely applied in various types of electronics. In the prior art, LCDs typically utilize amorphous silicon thin-film transistors (TFTs) as active elements. in general, the active array substrates of LCDs include electrostatic discharge (ESD) protection structures to prevent the elements and circuits on the active array substrates from damage due to electrostatic voltage surges. Usually, the ESD protection structures are fabricated during the manufacturing process of active array substrates. Therefore, in amorphous silicon TFT-LCDs, amorphous silicon semiconductor material is used in the ESD protection structure as well. However, the carrier mobility of the amorphous silicon semiconductor is unsatisfied, so that in many researches metal-oxide semiconductor material are promoted to replace the amorphous silicon semiconductor material. Unfortunately, metal-oxide semiconductor material exhibits unstable characteristics. For instance, the electrical performance is influenced by voltage stress, and lead to a shift in the threshold voltage of the metal-oxide semiconductor TFT. Similar problems occur in the ESD protection structures that use metal-oxide semiconductor material, and cause the instabilities of ESD protection structures. In view of the above, there exists in this art a need for an improved ESD protection structure that uses metal-oxide semiconductor material and provides greater electrical stabilities.

SUMMARY

According to one aspect of the present disclosure, there is provided an electrostatic discharge protection structure characterized in exhibiting extremely stable electrical characteristics. The electrostatic discharge is positioned on an active array substrate. The electrostatic discharge protection structure comprises a signal line, a first thin-film transistor and a shunt wire. The first thin-film transistor comprises a first gate electrode, a first metal-oxide semiconductor layer, a first source electrode and a first drain electrode. The first gate electrode is electrically connected to the signal line. The first metal-oxide semiconductor layer is disposed above the first gate electrode. The first metal-oxide semiconductor layer has a channel region characterized in having a width/length ratio of less than 1. The first source electrode is equipotentially connected to the first gate electrode. The first drain electrode is connected to the first source electrode through the first metal-oxide semiconductor layer, in which the first source electrode and the first drain electrode are positioned at opposite sides of the channel region. The shunt wire is electrically connected to the first drain electrode. When the signal line receives a voltage surge of greater than a predetermined magnitude, the voltage surge is shunted through the first thin-film transistor to the shunt wire.

According to one embodiment of the present disclosure, the electrostatic discharge protection structure further comprises a second thin-film transistor that electrically interconnects the first drain electrode and the shunt wire. The second thin-film transistor comprises a second gate electrode, a second metal-oxide semiconductor layer, a second source electrode and a second drain electrode. The second gate electrode is equipotentially connected to the first gate electrode. The second metal-oxide semiconductor layer is disposed above the second gate electrode, and the second metal-oxide semiconductor layer includes a channel region that has a width length ratio of less than 1. The second source electrode is equipotentially connected to the first drain electrode. The second drain electrode is equipotentially connected to the shunt wire.

According to one embodiment of the present disclosure, the electrostatic discharge protection structure further comprises a third thin-film transistor which includes a third gate electrode, a third metal-oxide semiconductor layer, a third source electrode and a third drain electrode. The third gate electrode is equipotentially connected to the shunt wire. The third metal-oxide semiconductor layer is disposed above the third gate electrode, and the third metal-oxide semiconductor layer includes a channel region that has a width/length ratio of less than 1. The third source electrode is equipotentially connected to the second drain electrode. The third drain electrode is connected to the third source electrode through the third metal-oxide semiconductor layer, and is electrically connected to the signal line.

According to one embodiment of the present disclosure, the electrostatic discharge protection structure further comprises a fourth thin-film transistor that electrically interconnects the third drain electrode and the signal line. The fourth thin-film transistor comprises a fourth gate electrode, a fourth metal-oxide semiconductor layer, a fourth source electrode and a fourth drain electrode. The fourth gate electrode is equipotentially connected to the third gate electrode. The fourth metal-oxide semiconductor layer is disposed above the fourth gate electrode, in which the fourth metal-oxide semiconductor layer includes a channel region that has a width/length ratio of less than 1. The fourth source electrode is equipotentially connected to the third drain electrode. The fourth drain electrode is connected to the third source electrode through the fourth metal-oxide semiconductor layer, and the fourth drain electrode is equipotentially connected to the signal line.

According to one embodiment of the present disclosure, the electrostatic discharge protection structure further comprises a fifth thin-film transistor that includes a fifth gate electrode, a fifth metal-oxide semiconductor layer, a fifth source electrode and a fifth drain electrode. The fifth gate electrode is equipotentially connected to the signal line. The fifth metal-oxide semiconductor layer is disposed above the fifth gate electrode, in which the fifth metal-oxide semiconductor layer includes a channel region that has a width/length ratio of less than 1. The fifth source electrode is equipotentially connected to the fifth gate electrode. The fifth drain electrode is connected to the fifth source electrode through the fifth metal-oxide semiconductor layer, and the fifth drain electrode is electrically connected to the shunt wire.

According to one embodiment of the present disclosure, the electrostatic discharge protection structure further comprises a sixth thin-film transistor that electrically interconnects the fifth drain electrode and the shunt wire. The sixth thin-film transistor comprises a sixth gate electrode, a sixth metal-oxide semiconductor layer, a sixth source electrode and a sixth drain electrode. The sixth gate electrode is equipotentially connected to the fifth gate electrode. The sixth metal-oxide semiconductor layer is disposed above the sixth gate electrode, in which the sixth metal-oxide semiconductor layer includes a channel region that has a width/length ratio of less than 1. The sixth source electrode is equipotentially connected to the fifth drain electrode. The sixth drain electrode is connected to the sixth source electrode through the sixth metal-oxide semiconductor layer, and the sixth drain electrode is electrically connected to the shunt wire.

According to one embodiment of the present disclosure, the electrostatic discharge protection structure further comprises a seventh thin-film transistor which includes a seventh gate electrode, a seventh metal-oxide semiconductor layer, a seventh source electrode and a seventh drain electrode. The seventh gate electrode is equipotentially connected to the shunt wire. The seventh metal-oxide semiconductor layer is disposed above the seventh gate electrode, and the seventh metal-oxide semiconductor layer includes a channel region that has a width/length ratio of less than 1. The seventh source electrode is equipotentially connected to the sixth drain electrode. The seventh drain electrode is connected to the seventh source electrode through the seventh metal-oxide semiconductor layer, and the seventh drain is electrically connected to the signal line.

According to one embodiment of the present disclosure, the electrostatic discharge protection structure further comprises a seventh thin-film transistor that electrically interconnects the seventh drain electrode and the signal line. The eighth thin-film transistor comprises an eighth gate electrode, an eighth metal-oxide semiconductor layer, an eighth source electrode and an eighth drain electrode. The eighth gate electrode is equipotentially connected to the seventh gate electrode. The eighth metal-oxide semiconductor layer is disposed above the eighth gate electrode, and the eighth metal-oxide semiconductor layer includes a channel region that has a width/length ratio of less than 1. The eighth source electrode is equipotentially connected to the seventh drain electrode. The eighth drain electrode is connected to the seventh source electrode through the eighth metal-oxide semiconductor layer, and the eighth drain electrode is equipotentially connected to the signal line.

According to one embodiment of the present disclosure, the signal line, the first source electrode and the first drain electrode are formed from a same layer, whereas the shunt wire and the first gate electrode are formed from a same layer.

According to another embodiment of the present disclosure, the electrostatic discharge protection structure comprises a signal line, a first thin-film transistor and a shunt wire. The first thin-film transistor comprises a first gate electrode, an insulating layer, a first metal-oxide semiconductor layer, a first source electrode and a first drain electrode. The first gate electrode is electrically connected to the signal line. The insulating layer covers the first gate electrode, in which the insulating layer has a first contact window. The first metal-oxide semiconductor layer is disposed on the insulating layer, and the first metal-oxide semiconductor layer includes a channel region that has a width/length ratio of less than 1. The first source electrode is disposed on both the first metal-oxide semiconductor layer and the insulating layer. The first source electrode is equipotentially connected through the first contact window to the first gate electrode. The first drain electrode is disposed on the first metal-oxide semiconductor layer and the insulating layer. The first source electrode and the first drain electrode are positioned at opposite sides of the channel region. The shunt wire is electrically connected to the first drain electrode. When a voltage surge that exceeds a predetermined magnitude is applied to the signal line, the voltage surge is shunted through the first thin-film transistor to the shunt wire.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
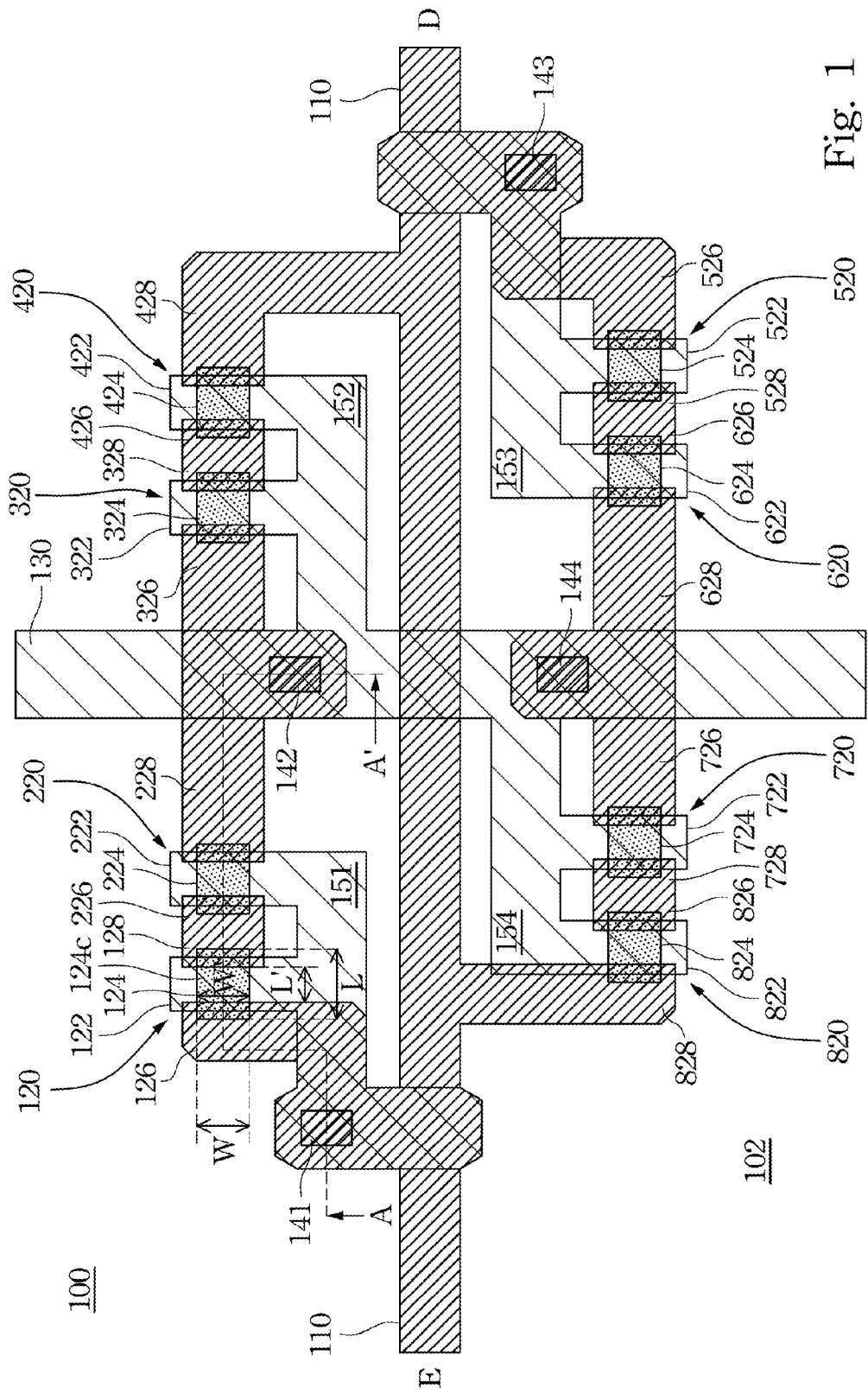
FIG. 1 is a top view schematically illustrating an electrostatic discharge protection structure according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

The term "electrically connected to" in the present disclosure refers to an electrical connection that allows voltage and current to be transmitted through a physical and conductive path or circuit.

Figure 2:
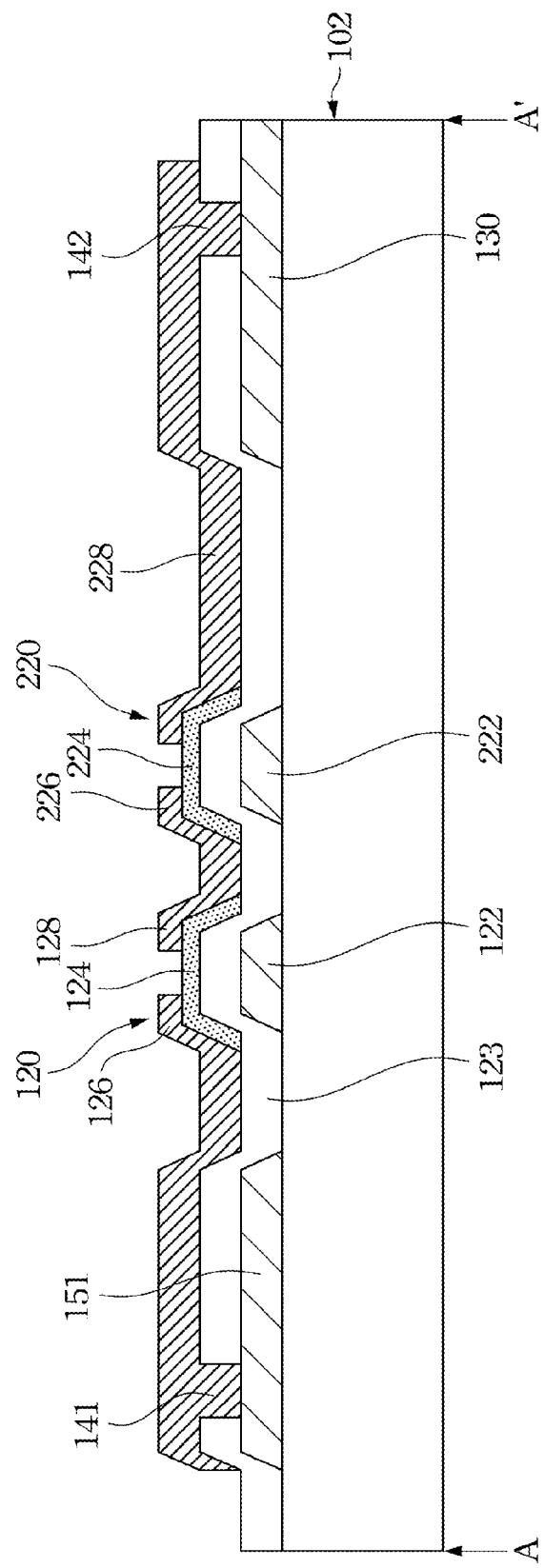
FIG. 2 is a cross-sectional view along line A-A' in FIG. 1.

FIG. 1 is a top view schematically illustrating an electrostatic discharge (ESD) protection structure 100 according to one embodiment of the present disclosure. FIG. 2 is a cross-sectional view along line A-A' in FIG. 1. The ESD protection structure 100 is positioned on an active array substrate 102. The active array substrate 102 may be an active array substrate for a thin-film transistor liquid crystal display device, for example. The ESD protection structure 100 may be arranged on a periphery of an active region (i.e. display region) of the active array substrate 102 for the purpose of protecting the elements and circuits on the active array substrate 102 from being damaged due to a voltage surge or a current surge.

With reference to FIG. 1, the ESD protection structure 100 includes a signal line 110, a first thin-film transistor 120 and a shunt wire 130.

In the embodiment depicted in FIG. 1 the signal line 110 may be a data line, for example. The D end of the signal line 110 may further extend into the active region of the active array substrate 102, whereas the E end of the signal line 110 is configured to electrically connect to an integrated circuit chip (IC chip). Accordingly, a voltage signal generated by the IC chip may be transmitted through the E end to the D end, and further transmitted to the active elements in the active region. The signal line may comprise metal materials with high conductivity such as aluminum, copper, nickel and silver. For the purpose of simplifying the figure, only one signal line 110 is depicted in FIG. 1 although the active array substrate 102 includes a number of signal lines 110.

The first thin-film transistor 120 includes a first gate electrode 122, a first metal-oxide semiconductor layer 124, a first source electrode 126 and a first drain electrode 128, as depicted in FIG. 1 and FIG. 2.

The first gate electrode 122 is electrically connected to signal line 110, so that a voltage signal applied to the signal line 110 may be transmitted to the first gate electrode 122. In one embodiment, the first gate electrode 122 is equipotentially connected to the signal line 110. For example, the first gate electrode 122 may be covered by an insulating layer 123 having a first contact window 141, as depicted in FIG. 1 and FIG. 2. The E point of the signal line 110 may be electrically connected through the first contact window 141 to the first connecting portion 151, and further the first connecting portion 151 is electrically connected to the first gate electrode 122. The first connecting portion 151 and the first gate electrode 122 are formed from a same metal layer with high conductivity. Accordingly, the electrical potential of the first gate electrode 122 is substantially equal to that of the signal line 110.

The first metal-oxide semiconductor layer 124 is disposed above the first gate electrode 122. The first metal-oxide semiconductor layer 124 includes a channel region 124c, and the width/length ratio (W'/L') of the channel region 124c is less than 1. The channel region herein refers to the region of the metal-oxide semiconductor layer between the source electrode and the drain electrode. The width/length ratio of the channel region herein is the ratio of the width W' of the channel region 124c over the length L' of the channel region 124c, as depicted in FIG. 1, in which the length L' is in a direction parallel to the direction of current flow or current-carrier flow in the metal-oxide semiconductor layer, and the width W' is in a direction perpendicular to the length L'. In one embodiment, the width/length ratio (W'/L') of the channel region 124c is about 0.2 to about 0.8, specifically about 0.5. The feature of the width/length ratio (W'/L') of less than 1 provides specific technical meaning, and is described in detail hereinafter. It is noted that the width W' and the length L' of the channel region 124c are possibly the same as or different from the width W and the length L of the first metal-oxide semiconductor layer 124, respectively.

The first metal-oxide semiconductor layer 124 may comprise a variety of metal-oxide semiconductor materials such as amorphous indium-gallium-zinc oxide (a-IGZO), indium zinc oxide (IZO), indium-zinc-tin oxide (IZTO) or the like.

The first source electrode 126 is equipotentially connected to signal line 110. In one embodiment, as depicted in FIG. 1, the first source electrode 126 extends from the signal line 110. Both the first source electrode 126 and the signal line 110 are formed in a same metal later, and therefore the electrical potential of the first source electrode 126 substantially equals that of the signal line 110.

The first source electrode 126 is equipotentially connected to the first gate electrode 122, as depicted in FIG. 1. In one embodiment, the first source electrode 126 is electrically connected to the first gate electrode 122 through the first contact window 141 and the first connecting portion 151 such that the first source electrode 126 and the first gate electrode 122 have a substantially identical voltage. When the voltage difference between the second drain electrode 228 and the first gate electrode 122 is greater than the threshold voltage of the first thin-film transistor 120, the voltage signal applied to the first source electrode 126 may be transmitted through the first metal-oxide semiconductor layer 124 to the first drain electrode 128. In other words, the first thin-film transistor 120 exhibits a characteristic like a diode.

The first drain electrode 128 is connected to the first source electrode 126 through the first metal-oxide semiconductor layer 124, as depicted in FIG. 1 and FIG. 2. The first drain electrode 128 may be formed from a same layer as the first source electrode 126, but the first drain electrode 128 are spaced apart from the first source electrode 126. The first drain electrode 128 and the first source electrode 126 are positioned at opposite sides of the first metal-oxide semiconductor layer 124. The portion of the first metal-oxide semiconductor layer 124 located between the first drain electrode 128 and the first source electrode 126 is provided as the channel region 124c.

The shunt wire 130 is electrically connected to the first drain electrode 128, so that a voltage signal (or current) applied to the first drain electrode 128 may be transmitted to the shunt wire 130. There is no specific limitation on the approach of electrical connection between the shunt wire 130 and the first drain electrode 128. In the embodiment depicted in FIG. 1, the first drain electrode 128 is electrically connected to the shunt wire 130 through the second thin-film transistor 220 and the second contact window 142. The features of the second thin-film transistor 220 are described in detail hereinafter. The shunt wire 130 is configured to shunt the current on the first drain electrode 128 to other circuits. In one embodiment, the shunt wire 130 may be an inner short ring that encircles the active region and physically connects to all signal lines 110 in the active region. Accordingly, the current transmitted to the shunt wire 130 may be shunted to other signal lines. Specifically, with reference to FIG. 1, when a voltage surge appears at the E end of the signal line 110 caused by electrostatic charges, the voltage surge is transmitted to the first source electrode 126, and simultaneously transmitted to the first gate electrode 122 through the first contact window 141 and the first connecting portion 151. At this moment, the first thin-film transistor 120 is conducting, and allows currents to be transmitted from the first source electrode 126 to the first drain electrode 128. Accordingly, the voltage surge applied on the E end is shunted to the shunt wire 130 through the first drain electrode 128. As a result, the voltage and/or current transmitted to the D end of the signal line 110 may be decreased, and thereby prevents the elements and circuits in the active region from being damaged by the voltage and/or current surge. On the other hand, when the voltage applied on the E end is within a normal range, which is lower than the threshold voltage of the first thin-film transistor 120, the first source electrode 126 is not conductive to the first drain electrode 128. The normal signal applied on the E ends of the signal line 110 may be correctly transmitted to the D end without being diminished, so that the voltage on the D end substantially equals that on the E end. Therefore, when a normal signal is applied on the E end, it may be correctly and appropriately be transmitted to the D ends, and then be transmitted to the circuits and element in the active region.

It is necessary that the width/length ratio (W/L) of the channel region 124c is less than 1, and this feature resolves drawbacks in the prior art. In the prior art, the width/length ratio of the channel region 124c is designed to have a value of greater than 3, specifically about 6 to about 8, for the purpose of rapidly and effectively shunting the voltage surge to the inner short ring. However, the inventor of the present disclosure discovers that this configuration leads to many technical problems when the semiconductor layer is made of metal-oxide semiconductor material. For example, the threshold voltage of the thin-film transistor is undesirably shifted. In particular, the threshold voltage of the thin-film transistor is gradually varied and shifted along with the time period of a voltage stress on the thin-film transistor. When a normal signal voltage is applied on the E end of the signal line 110, the first thin-film transistor 120, which is desired to be in an OFF state, may not appropriately be turned OFF, so that the normal signal voltage is shunted to the shunt wire 130 (i.e., inner short ring). As a result, the normal signal voltage may not correctly be transmitted to the D end of the signal line 110, and also may not be correctly transmitted to the circuits in the active region. Unexpectedly, the inventor discovers that the instability of the metal-oxide thin-film transistor 120 may be improved when the width/length ratio (W'/L') of the channel region 124c is less 1.

In the embodiment described above, the first source electrode 126 and the first drain electrode 128 may be formed in a same layer as the signal line 110. In addition, the first gate electrode 122 may be formed in a same layer as the shunt wire 130. Accordingly, the signal line 110, the first source electrode 126 and the first drain electrode 128 may be made of an identical material. Also, the shunt wire 130 and the first gate electrode 122 may be made of an identical material.

In one embodiment, the ESD protection structure 100 further includes a second thin-film transistor 220, as depicted in FIG. 1 and FIG. 2. The first drain electrode 128 is electrically connected to the shunt wire 130 through the second thin-film transistor 220. The second thin-film transistor 220 includes a second gate electrode 222, a second metal-oxide semiconductor layer 224, a second source electrode 226 and a second drain electrode 228. The second gate electrode 222 is equipotentially connected to first gate electrode 122. Specifically, the second gate electrode 222 extends from the first connecting portion 151, all of the second gate electrode 222, the first gate electrode 122 and the first connecting portion 151 are physically connected, and are formed from a same metal layer, so that the electrical potential of the second gate electrode 222 is substantially the same as that of the first gate electrode 122. The second metal-oxide semiconductor layer 224 is disposed right above the second gate electrode 222. The second metal-oxide semiconductor layer 224 includes a channel region that has a width/length ratio of less than 1. The width/length ratio of the channel region of the second metal-oxide semiconductor layer 224 may be the same as that of the first metal-oxide semiconductor layer 124. The second source electrode 226 is equipotentially connected to the first drain electrode 128. In particular, the second source electrode 226 and the first drain electrode 128 are physically connected, and are formed in a same metal layer. Moreover, the second drain electrode 228 is connected to the second source electrode 226 through the second metal-oxide semiconductor layer 224. The second drain electrode 228 is further connected to the shunt wire 130 equipotentially. In one example, the insulating layer 123 has a second contact window 142 which overlaps the shunt wire 130. The second drain electrode 228 is equipotentially connected to the shunt wire 130 through the second contact window 142.

In one embodiment, the first and the second thin-film transistors 120, 220 may have an identical structure and an identical threshold voltage. Since the second gate electrode 222 is equipotentially connected to the first gate electrode 122, the second thin-film transistor 220 and the first thin-film transistor 120 may simultaneously be turned ON or turned OFF. When the first thin-film transistor 120 is conducting, the signal voltage on the signal line 110 may be transmitted to the shunt wire 130 through the first contact window 141, the first thin-film transistor 120 and the second thin-film transistor 220.

Unexpectedly, the problem in the variation of threshold voltage may thoroughly be resolved by the manner of the connection between the first and the second thin-film transistors 120, 220 described hereinbefore. The characteristic of the metal-oxide thin-film transistor critically differs from that of amorphous silicon thin-film transistor (a-Si TFT). The property of amorphous silicon semiconductor material is more stable, so that the a-Si TFT rarely has problems in the threshold voltage variation. However, the property of metal-oxide semiconductor material is critical and unstable, so that the electrical characteristics varies and are influenced by the voltage stress applied thereto. The threshold voltages of both the first and the second thin-film transistors 120, 220 unexpectedly become extremely stable by using the connection manner between the first and the second thin-film transistor 120, 220 described above. Accordingly, the ESD protection structure 100 exhibits stable electrical characteristics.

In one embodiment, ESD protection structure 100 further includes a third thin-film transistor 320, as depicted in FIG. 1. The third thin-film transistor 320 includes a third gate electrode 322, a third metal-oxide semiconductor layer 324, a third source electrode 326 and a third drain electrode 328. The third gate electrode 322 is equipotentially connected to the shunt wire 130. For instance, the third gate electrode 322 extends from the shunt wire 130, and is formed in a same metal layer as the shunt wire 130. Accordingly, the electrical potential of the third gate electrode 322 is substantially the same as that of the shunt wire 130. The third metal-oxide semiconductor layer 324 is disposed right above the third gate electrode 322. The third metal-oxide semiconductor layer 324 includes a channel region that has a width/length ratio of less than 1. The third source electrode 326 is equipotentially connected to the second drain electrode 228, and is equipotentially connected to the shunt wire 130 as well through the second contact window 142. In one example, the third source electrode 326 extends from the second drain electrode 228, and is formed in a same layer as the second drain electrode 228. The third drain electrode 328 is connected to the third source electrode 326 through the third metal-oxide semiconductor layer 324. The fourth drain electrode 428 is electrically connected to signal line 110. In this embodiment, when a voltage surge is transmitted to the fourth drain electrode 428 and the third gate electrode 322, in which the voltage of the voltage surge is greater than the threshold voltage of the third thin-film transistor 320, the third thin-film transistor 320 is turned ON. Therefore, the currents on the shunt wire 130 and the second drain electrode 228 may be transmitted through the third source electrode 326 and the third drain electrode 328 to the signal line 110 at a position between the E end and the D end. In one embodiment, the third drain electrode 328 is electrically connected to the signal line 110 through the fourth thin-film transistor 420, which is described in detail hereinafter.

The ESD protection structure 100 further includes a fourth thin-film transistor 420, in which the third drain electrode 328 electrically connected to signal line 110 through the fourth thin-film transistor 420. The fourth thin-film transistor 420 includes a fourth gate electrode 422, a fourth metal-oxide semiconductor layer 424, a fourth source electrode 426 and a fourth drain electrode 428. The fourth gate electrode 422 is equipotentially connected to the third gate electrode 322 through the second connecting portion 152. The cross-sectional structure of the second connecting portion 152 may be the same as that of the first connecting portion 151. The fourth metal-oxide semiconductor layer 424 is disposed right above the fourth gate electrode 422. The fourth metal-oxide semiconductor layer 424 includes a channel region that has a width/length ratio of less than 1. The fourth source electrode 426 is equipotentially connected to the third drain electrode 328. The fourth drain electrode 428 is connected to the third source electrode 326 through the fourth metal-oxide semiconductor layer 424. The fourth drain electrode 428 is equipotentially connected to the signal line 110. In this embodiment, the third and the fourth thin-film transistors 320, 420 may have an identical threshold voltage. Since the third gate electrode 322 is equipotentially connected to the fourth gate electrode 422, the third and the fourth thin-film transistors 320, 420 may simultaneously be turned ON or OFF.

In one embodiment, the ESD protection structure 100 further includes a fifth thin-film transistor 520. The fifth thin-film transistor 520 includes a fifth gate electrode 522, a fifth metal-oxide semiconductor layer 524, a fifth source electrode 526 and a fifth drain electrode 528. The fifth gate electrode 522 is equipotentially connected to the signal line 110 through the third connecting portion 153 and the third contact window 143. Accordingly, the electrical potential of the fifth gate electrode 522 substantially equals that of the fourth drain electrode 428. The cross-sectional structure of the third connecting portion 153 is similar to that of the first connecting portion 151. The fifth metal-oxide semiconductor layer 524 is disposed right above the fifth gate electrode 522. The fifth metal-oxide semiconductor layer 524 includes a channel region that has a width/length ratio of less than 1, The fifth source electrode 526 is equipotentially connected to the fifth gate electrode 522 through the third contact window 143 and the third connecting portion 153. The fifth drain electrode 528 is connected to the fifth source electrode 526 through the fifth metal-oxide semiconductor layer 524. The sixth drain electrode 628 is electrically connected to the shunt wire 130. The cross-sectional structure of the fifth thin-film transistor 520 may be the same as that of the first thin-film transistor 120, and also the cross-sectional structure of the third contact window 143 may be the same as that of the first contact window 141. In this embodiment, when the difference in electrical potential between the E end and the fourth drain electrode 428 is greater than the threshold voltage of the fifth thin-film transistor 520, the fifth thin-film transistor 520 is turned ON, and thereby allows the current on the fourth drain electrode 428 to be transmitted to the shunt wire 130 through the fifth source electrode 526 and the fifth drain electrode 528.

In one embodiment, the ESD protection structure 100 further includes a sixth thin-film transistor 620, in which the fifth drain electrode 528 is electrically connected to the shunt wire 130 through the sixth thin-film transistor 620. Specifically, the sixth thin-film transistor 620 includes a sixth gate electrode 622, a sixth metal-oxide semiconductor layer 624, a sixth source electrode 626 and a sixth drain electrode 628. The sixth gate electrode 622 is equipotentially connected to fifth gate electrode 522 through the third connecting portion 153. In particular, the sixth gate electrode 622, the third connecting portion 153 and the fifth gate electrode 522 are formed in an identical metal layer. The sixth metal-oxide semiconductor layer 624 is disposed right above the sixth gate electrode 622. The sixth metal-oxide semiconductor layer 624 includes a channel region that has a width/length ratio of less than 1. The sixth source electrode 626 is equipotentially connected to the fifth drain electrode 528. Particularly, the sixth source electrode 626 and the fifth drain electrode 528 are formed in an identical metal layer. The sixth drain electrode 628 is connected to the sixth source electrode 626 through the sixth metal-oxide semiconductor layer 624. Furthermore, the sixth drain electrode 628 is equipotentially connected to the shunt wire 130 through the fourth contact window 144. The cross-sectional structure of the fourth contact window 144 may be the same as that of the second contact window 142. In this embodiment, the fifth and the sixth thin-film transistors 520, 620 may an identical threshold voltage, and may be simultaneously turned ON or turned OFF since the sixth gate electrode 622 is equipotentially connected to the fifth gate electrode 522. When a voltage surge is transmitted to the fifth source electrode 526, in which the voltage of the voltage surge is greater than the threshold voltage of the fifth thin-film transistor 520, both the fifth and the sixth thin-film transistors 520, 620 are turned ON simultaneously. Therefore, the voltage surge on the fifth source electrode 526 may be transmitted to the sixth drain electrode 628, and further be transmitted to the shunt wire 130 through the fourth contact window 144.

In one embodiment, the ESD protection structure 100 further includes a seventh thin-film transistor 720 and an eighth thin-film transistor 820. The seventh thin-film transistor 720 includes a seventh gate electrode 722, a seventh metal-oxide semiconductor layer 724, a seventh source electrode 726 and a seventh drain electrode 728. The seventh gate electrode 722 is equipotentially connected to the shunt wire 130 through the fourth connecting portion 154. The cross-sectional structure of the fourth connecting portion 154 may be the same as that of the first connecting portion 151. The seventh metal-oxide semiconductor layer 724 is disposed right above the seventh gate electrode 722. The seventh metal-oxide semiconductor layer 724 includes a channel region that has a width/length ratio of less than 1. The seventh source electrode 726 extends from the sixth drain electrode 628, so that the seventh source electrode 726 is equipotentially connected to the sixth drain electrode 628. The seventh drain electrode 728 is connected to the seventh source electrode 726 through the seventh metal-oxide semiconductor layer 724. Furthermore, the seventh drain electrode 728 is electrically connected to the signal line 110 through the eighth thin-film transistor 820. The eighth thin-film transistor 820 includes an eighth gate electrode 822, an eighth metal-oxide semiconductor layer 824, an eighth source electrode 826 and an eighth drain electrode 828. The eighth gate electrode 822 is equipotentially connected to the seventh gate electrode 722 through the fourth connecting portion 154. The eighth metal-oxide semiconductor layer 824 is disposed above the eighth gate electrode 822. The eighth metal-oxide semiconductor layer 824 includes a channel region that has a width/length ratio of less than 1. The eighth source electrode 826 is equipotentially connected to the seventh drain electrode 728. Particularly, the eighth source electrode 826 and the seventh drain electrode 728 are formed in a same metal layer. The eighth drain electrode 828 is connected to the seventh source electrode 726 through the eighth metal-oxide semiconductor layer 824. Moreover, the eighth drain electrode 828 is equipotentially connected to the signal line 110. The features and functions of the seventh and eighth thin-film transistors 720, 820 are similar to the third and the fourth thin-film transistors 320, 420 described above.

Figure 3:
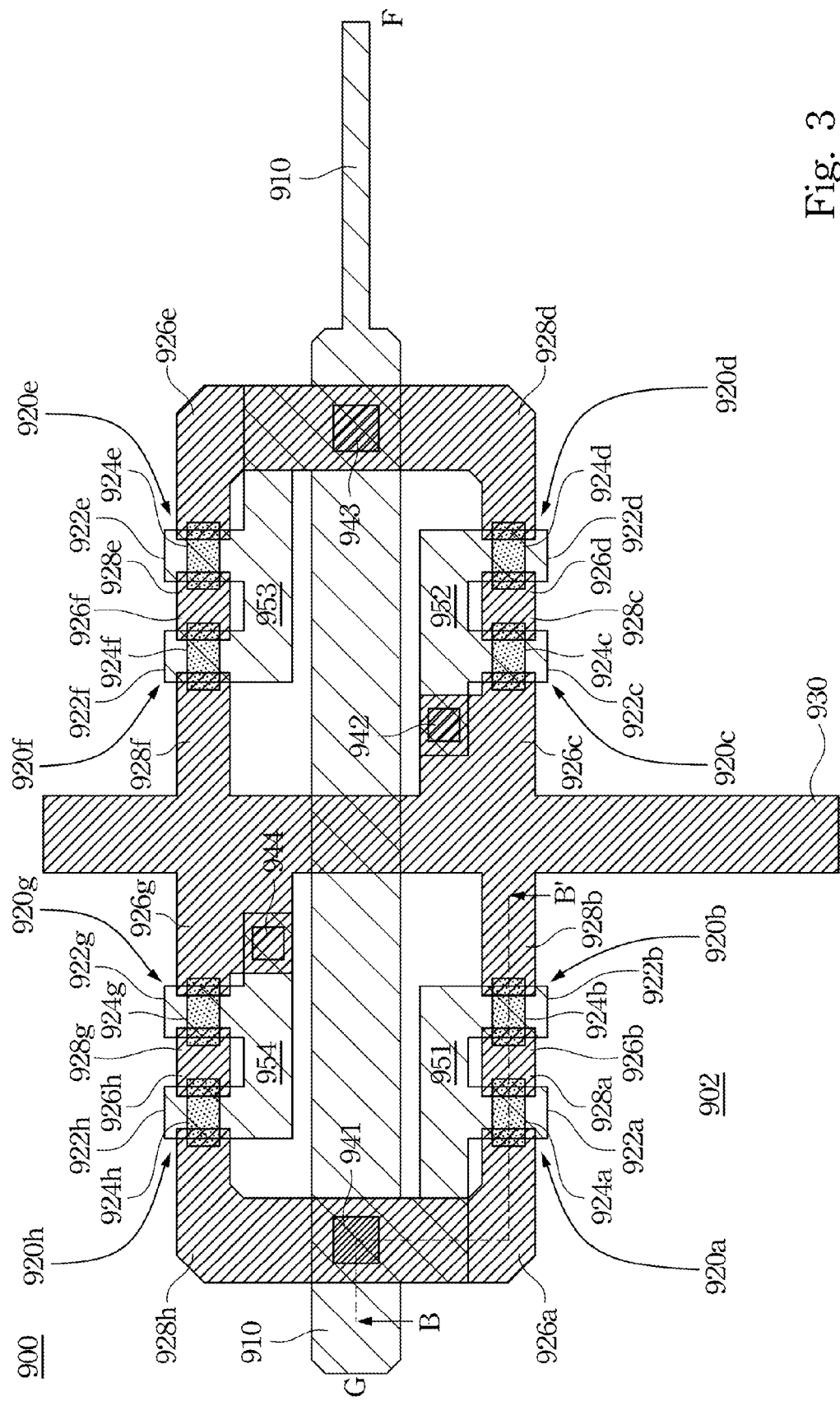
FIG. 3 is a top view illustrating an ESD protection structure according to another embodiment of the present disclosure.
Figure 4:
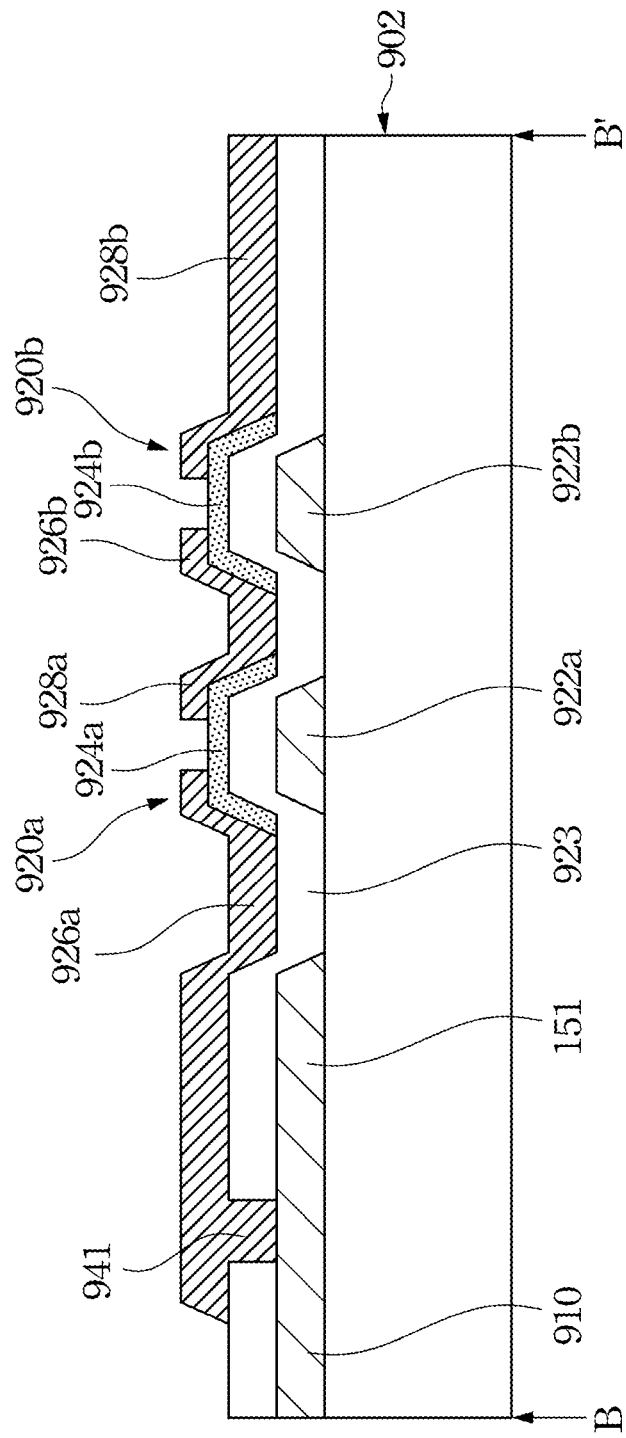
FIG. 4 is a cross-sectional view along line B-B' in FIG. 3

FIG. 3 is a top view illustrating an ESD protection structure 900 according to another embodiment of the present disclosure. FIG. 4 is a cross-sectional view along line B-B' in FIG. 3. The ESD protection structure 900 includes a signal line 910, a shunt wire 930, a ninth thin-film transistor (TFT) 920a, a tenth TFT 920b, an eleventh TFT 920c, a twelfth TFT 920d, a thirteenth TFT 920e, a fourteenth TFT 920f, a fifteenth TFT 920g and sixteenth TFT 920h, as well as a fifth, a sixth, a seventh and an eighth connecting portion 951-954.

In FIG. 3, the signal line 910 of the ESD protection structure 900 may be a gate line. The F end of the signal line 910 may further extends into an active region of the active array substrate 902. The G end of the signal line 910 may be electrically connected to an IC chip. Accordingly, a voltage signal generated by the IC chip may be transmitted from the G end to the F end. The signal line 910 may comprise metal materials with high conductivity such as aluminum, copper, nickel and silver. For the purpose of simplifying the figure, only one signal line 910 is depicted in FIG. 1 while the active array substrate including a number of signal lines 910.

With reference to FIG. 3, the ninth-sixteenth TFTs 920a-920h include corresponding ninth-sixteenth gate electrodes 922a-922h, corresponding ninth-sixteenth metal-oxide semiconductor layers 924a-924h, corresponding ninth-sixteenth source electrodes 926a-926h and corresponding ninth sixteenth drain electrodes 928a-928h. The gate electrodes 922a-922h, the signal line 910 and the fifth-eighth connecting portions 951-954 are formed from a same metal layer, and are fabricated by a same photolithography process, in which the shapes, positions and the dimensions thereof are defined by using a same photomask. The ninth-sixteenth source electrodes 926a-926h, the ninth-sixteenth drain electrodes 928a-928h and the shunt wire 930 are formed from a same metal layer that is different from the metal layer of the signal line 910. The insulating layer 923 is sandwiched between the two metal layers, as depicted in FIG. 4. Specifically, the gate electrodes 922a-922h, signal line 910 and the fifth-eighth connecting portions 951-954 are formed at a first metal layer. The insulating layer 923 covers most of the first metal layer. The ninth-sixteenth source electrodes 926a-926h, the ninth-sixteenth drain electrodes 928a-928h and the shunt wire 930 are formed at a second metal layer which is located over the insulating layer 923. The insulating layer 923 has a fifth contact window 941, a sixth contact window 942, a seventh contact window 943 and an eighth contact window 944. The first and the second metal layers are conducting through the fifth-eighth contact windows 941-944.

The fifth connecting portion 951 and the seventh connecting portion 953 extend from opposite sides of the signal line 910. The ninth and the tenth gate electrodes 922a, 922b extend from the fifth connecting portion 951. The thirteenth and the fourteenth gate electrodes 922e, 922f extend from the seventh connecting portion 953. The sixth connecting portion 952 and the eighth connecting portion 954 are electrically connected to the shunt wire 930 respectively through the sixth contact window 942 and the eighth contact window 944. Both the sixth and seventh connecting portions 952, 954 are not physically in contact with the signal line 930. The eleventh and the twelfth gate electrodes 922c, 922d extend from the sixth connecting portion 952. The fifteenth and the sixteenth gate electrodes 922g, 922h extend from the eighth connecting portion 954.

Each of the ninth to sixteenth metal-oxide semiconductor layers 924a-924h includes a channel region that has a width/length ratio of less than 1.

When a voltage surge appears at the G end of the signal line 910 due to electrostatic charges, the nintgh and the tenth TFT 920a, 920b are turned ON since the voltage surge is transmitted to the ninth and the tenth gate electrodes 922a, 922b through the fifth connecting portion 951. Accordingly, the voltage surge is shunted to the ninth source electrodes 926a through the fifth contact window 941. In particular, the voltage surge may be shunted to the shunt wire 930 through the ninth source electrodes 926a, the ninth drain electrodes 928a, the tenth source electrode 926b and the tenth drain electrode 928b. As a result, the voltage and/or the current transmitted to the D end of the signal line 110 may he decreased, and thereby prevents the elements and circuits in the active region from being damaged by the voltage surge. When the voltage surge that transmits to the shunt wire 930 has a magnitude of greater than the threshold voltage of the eleventh and the twelfth TFTs 920c, 920d, the eleventh. and the twelfth TFTs 920c, 920d are turned ON, so that the eleventh source electrode 926c is conductive to the twelfth drain electrode 928d. Therefore, the voltage (or current) transmitted to the twelfth drain electrode 928d is further decreased. Furthermore, when the voltage surge transmitted to the thirteenth source electrode 926e, through the twelfth drain electrode 928d, has a magnitude greater than the threshold voltage of the thirteenth and the fourteenth TFTs 920e, 920f, the thirteenth and the fourteenth TFTs 920e, 920f are turned ON such that the thirteenth source electrode 926e is conductive to the fourteenth drain electrode 928f, and allowing the remaining the voltage surge to be shunted to the shunt wire 930. Further, if the voltage on the shunt wire 930 is still greater than the threshold voltages of the fifteenth and the sixteenth TFTs 920g, 920h, the fifteenth and the sixteenth TFTs 920g, 920h are turned ON, and allowing the fifteenth source electrode 926g is conductive to the sixteenth drain electrode 928h. According to the embodiments disclosed herein, the ESD protection structures may effectively shunts the voltage surge, and avoid the voltage surge from being transmitted to the active area through the F end of the signal line 910.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electrostatic discharge protection structure positioned on an active array substrate, the electrostatic discharge protection structure comprising:
  a signal line;
  a first thin-film transistor, comprising:
    a first gate electrode electrically connected to the signal line;
    a first metal-oxide semiconductor layer comprising a first channel region that has a first width/length ratio of less than 1, the first metal-oxide semiconductor layer being disposed above the first gate electrode;
    a first source electrode equipotentially connected to the first gate electrode; and
    a first drain electrode connected to the first source electrode through the first metal-oxide semiconductor layer, wherein the first source electrode and the first drain electrode are positioned at opposite sides of the first channel region;
  a shunt wire electrically connected to the first drain electrode, wherein when the signal line receives a voltage surge of greater than a predetermined magnitude, the voltage surge is shunted through the first thin-film transistor to the shunt wire;
  a second thin-film transistor that electrically interconnects the first drain electrode and the shunt wire, wherein the second thin-film transistor comprises:
    a second gate electrode equipotentially connected to the first gate electrode;
    a second metal-oxide semiconductor layer comprising a second channel region that has a second width/length ratio of less than 1, the second metal-oxide semiconductor layer being disposed above the second gate electrode;

a second source electrode equipotentially connected to the first drain electrode; and a second drain electrode equipotentially connected to the shunt wire; a third thin-film transistor which comprises:

a third gate electrode equipotentially connected to the shunt wire;

a third metal-oxide semiconductor layer comprising a third channel region that has a third width/length ratio of less than 1, the third metal-oxide semiconductor layer being disposed above the third gate electrode;

a third source electrode equipotentially connected to the second drain electrode; and a third drain electrode connected to the third source electrode through the third metal-oxide semiconductor layer, wherein the third drain electrode is electrically connected to the signal line; and a fourth thin-film transistor that electrically interconnects the third drain electrode and the signal line, wherein the fourth thin-film transistor comprises:

a fourth gate electrode equipotentially connected to the third gate electrode;

a fourth metal-oxide semiconductor layer comprising a fourth channel region that has a fourth width/length ratio of less than 1, the fourth metal-oxide semiconductor layer being disposed above the fourth gate electrode;

a fourth source electrode equipotentially connected to the third drain electrode; and a fourth drain electrode connected to the third source electrode through the fourth metal-oxide semiconductor layer, wherein the fourth drain electrode is equipotentially connected to the signal line.

2. The electrostatic discharge protection structure according to claim 1, further comprising a fifth thin-film transistor that comprises:

a fifth gate electrode equipotentially connected to the signal line;

a fifth metal-oxide semiconductor layer comprising a fifth channel region that has a fifth width/length ratio of less than 1, the fifth metal-oxide semiconductor layer being disposed above the fifth gate electrode;

a fifth source electrode equipotentially connected to the fifth gate electrode; and a fifth drain electrode connected to the fifth source electrode through the fifth metal-oxide semiconductor layer, wherein the fifth drain electrode is electrically connected to the shunt wire.

3. The electrostatic discharge protection structure according to claim 2, further comprising a sixth thin-film transistor that electrically interconnects the fifth drain electrode and the shunt wire, wherein the sixth thin-film transistor comprises:

a sixth gate electrode equipotentially connected to the fifth gate electrode;

a sixth metal-oxide semiconductor layer comprising a sixth, channel region that has a sixth width/length ratio of less than 1, the sixth metal-oxide semiconductor layer being disposed above the sixth gate electrode;

a sixth source electrode equipotentially connected to the fifth drain electrode; and a sixth drain electrode connected to the sixth source electrode through the sixth metal-oxide semiconductor layer, wherein the sixth drain electrode is electrically connected to the shunt wire.

4. The electrostatic discharge protection structure according to claim 3, further comprising a seventh thin-film transistor which comprises:

a seventh gate electrode equipotentially connected to the shunt wire;

a seventh metal-oxide semiconductor layer comprising a seventh channel region that has a seventh width/length ratio of less than 1, the seventh metal-oxide semiconductor layer being disposed above the seventh gate electrode;

a seventh source electrode equipotentially connected to the sixth drain electrode; and a seventh drain electrode connected to the seventh source electrode through the seventh metal-oxide semiconductor layer, wherein the seventh drain electrode is electrically connected to the signal line.

5. The electrostatic discharge protection structure according to claim 4, further comprising an eighth thin-film transistor that electrically interconnects the seventh drain electrode and the signal line, wherein the eighth thin-film transistor comprises:

an eighth gate electrode equipotentially connected to the seventh gate electrode;

an eighth metal-oxide semiconductor layer comprising an eighth channel region that has an eighth width/length ratio of less than 1, the eighth metal-oxide semiconductor layer being disposed above the eighth gate electrode;

an eighth source electrode equipotentially connected to the seventh drain electrode; and an eighth drain electrode connected to the seventh source electrode through the eighth metal-oxide semiconductor layer, wherein the eighth drain electrode is equipotentially connected to the signal line.

6. The electrostatic discharge protection structure according to claim 1, wherein the signal line, the first source electrode and the first drain electrode are formed from a same layer.

7. The electrostatic discharge protection structure according to claim wherein the shunt wire and the first gate electrode are formed from a same layer.

8. An electrostatic discharge protection structure positioned on an active array substrate, the electrostatic discharge protection structure comprising:

a signal line;

a first thin-film transistor, comprising:

a first gate electrode electrically connected to the signal line;

an insulating layer covering the first gate electrode, wherein the insulating layer has a first contact window;

a first metal-oxide semiconductor layer comprising a first channel region that has a first width/length ratio of less than 1, the first metal-oxide semiconductor layer being disposed on the insulating layer;

a first source electrode disposed on the first metal-oxide semiconductor layer and the insulating layer, wherein the first source electrode is equipotentially connected to the first gate electrode through the first contact window; and a first drain electrode disposed on the first metal-oxide semiconductor layer and the insulating layer, wherein the first source electrode and the first drain electrode are positioned at opposite sides of the first channel region;

a shunt wire electrically connected to the first drain electrode, wherein when a voltage surge that exceeds a predetermined magnitude is applied to the signal line, the voltage surge is shunted through the first thin-film transistor to the shunt wire;

a second thin-film transistor that electrically interconnects the first drain electrode and the shunt wire, wherein the second thin-film transistor comprises:
  a second gate electrode equipotentially connected to the first gate electrode;
  a second metal-oxide semiconductor layer comprising a second channel region that has a second width/length ratio of less than 1, the second metal-oxide semiconductor layer being disposed above the second gate electrode;
  a second source electrode equipotentially connected to the first drain electrode; and
  a second drain electrode equipotentially connected to the shunt wire; a third thin-film transistor which comprises:
  a third gate electrode equipotentially connected to the shunt wire;
  a third metal-oxide semiconductor layer comprising a third channel region that has a third width/length ratio of less than 1, the third metal-oxide semiconductor layer being disposed above the third gate electrode;
  a third source electrode equipotentially connected to the second drain electrode; and
  a third drain electrode connected to the third source electrode through the third metal-oxide semiconductor layer, wherein the third drain electrode is electrically connected to the signal line; and
a fourth thin-film transistor that electrically interconnects the third drain electrode and the signal line, wherein the fourth thin-film transistor comprises:
  a fourth gate electrode equipotentially connected to the third gate electrode;
  a fourth metal-oxide semiconductor layer comprising a fourth channel region that has a fourth width/length ratio of less than 1, the fourth metal-oxide semiconductor layer being disposed above the fourth gate electrode;
  a fourth source electrode equipotentially connected to the third drain electrode; and
  a fourth drain electrode connected to the third source electrode through the fourth metal-oxide semiconductor layer, wherein the fourth drain electrode is equipotentially connected to the signal line.

* * * * *